United States Patent
Liu et al.

(10) Patent No.: US 10,060,024 B2
(45) Date of Patent: *Aug. 28, 2018

(54) SPUTTERING TARGET FOR PVD CHAMBER

(71) Applicant: Applied Materials, Inc., Santa Clara, CA (US)

(72) Inventors: Zhendong Liu, San Jose, CA (US); Rongjun Wang, Dublin, CA (US); Xianmin Tang, San Jose, CA (US); Srinivas Gandikota, Santa Clara, CA (US); Tza-Jing Gung, San Jose, CA (US); Muhammad M. Rasheed, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/679,480

(22) Filed: Aug. 17, 2017

(65) Prior Publication Data

US 2017/0350001 A1 Dec. 7, 2017

Related U.S. Application Data (63) Continuation of application No. 12/723,199, filed on Mar. 12, 2010, now Pat. No. 9,752,228.

(60) Provisional application No. 61/166,682, filed on Apr. 3, 2009.

(51) Int. Cl.
*C23C 14/34* (2006.01)
*H01J 37/34* (2006.01)

(52) U.S. Cl.
CPC ........ *C23C 14/3407* (2013.01); *H01J 37/342* (2013.01); *H01J 37/3423* (2013.01)

(58) Field of Classification Search
CPC ............................ H01J 37/342; H01J 37/3423
See application file for complete search history.

(56) References Cited

U.S. PATENT DOCUMENTS

| | | |
|---|---|---|
| 4,604,180 A | 8/1986 | Hirukawa et al. |
| 4,747,926 A | 5/1988 | Shimizu et al. |
| 4,874,494 A | 10/1989 | Ohmi |
| 5,334,302 A | 8/1994 | Kubo et al. |
| 5,556,525 A | 9/1996 | Krivokapic et al. |
| 5,580,428 A | 12/1996 | Krivokapic et al. |
| 6,059,945 A | 5/2000 | Fu et al. |
| 7,037,413 B1 | 5/2006 | Otoba et al. |
| 7,146,703 B2 | 12/2006 | Ivanov |

(Continued)

FOREIGN PATENT DOCUMENTS

| | | |
|---|---|---|
| CN | 1620712 A | 5/2005 |
| CN | 101089220 A | 12/2007 |

(Continued)

OTHER PUBLICATIONS

International Search Report and Written Opinion in PCT/US2010/029171, dated Oct. 22, 2010, 8 pages.

*Primary Examiner* — Jason Berman
(74) *Attorney, Agent, or Firm* — Servilla Whitney LLC (57) ABSTRACT

Target assemblies and PVD chambers including target assemblies are disclosed. The target assembly includes a target that has a concave shaped target. When used in a PVD chamber, the concave target provides more radially uniform deposition on a substrate disposed in the sputtering chamber.

15 Claims, 10 Drawing Sheets

(56) References Cited

U.S. PATENT DOCUMENTS

| | | |
|---|---|---|
| 9,752,228 B2 * | 9/2017 | Liu .................... C23C 14/3407 |
| 2008/0095952 A1 | 4/2008 | Storey |
| 2008/0173541 A1 | 7/2008 | Lee et al. |
| 2008/0185287 A1 | 8/2008 | Chen |

FOREIGN PATENT DOCUMENTS

| | | |
|---|---|---|
| JP | 627852 A | 1/1987 |
| JP | 62-287071 A | 12/1987 |
| JP | H01128423 A | 5/1989 |
| JP | H03226570 A | 10/1991 |
| JP | 2000-199057 A | 7/2000 |
| JP | 2000-265270 A | 9/2000 |
| JP | 2003-226969 A | 8/2003 |
| JP | 2004-083985 A | 3/2004 |
| JP | 2007-227214 A | 9/2007 |

* cited by examiner

SPUTTERING TARGET FOR PVD CHAMBER

CROSS-REFERENCE TO RELATED APPLICATIONS

This application is a Continuation of U.S. patent application Ser. No. 12/723,199, filed Mar. 12, 2010, now U.S. Pat. No. 9,752,228, issued, Sep. 5, 2017, which claims the benefit of U.S. Provisional Patent Application Ser. No. 61/166,682, filed Apr. 3, 2009, to each of which priority is claimed and each of which are incorporated herein by reference in their entireties.

FIELD OF THE INVENTION

Embodiments of the present invention generally pertain to the field of physical vapor deposition. More specifically, embodiments of the invention relate to a concave sputtering target design to improve film uniformity of films deposited within a physical vapor deposition chamber, chambers including a concave sputtering target and methods of sputtering material onto a substrate using a concave target.

BACKGROUND

Sputtering is a physical vapor deposition (PVD) process in which high-energy ions impact and erode a solid target and deposit the target material on the surface of a substrate such as a semiconductor substrate, a specific example being a silicon wafer. In semiconductor fabrication, the sputtering process is usually accomplished within a semiconductor fabrication chamber also known as a PVD process chamber or a sputtering chamber.

A sputtering chamber is used to sputter deposit material onto a substrate to manufacture electronic circuits, such as for example, integrated circuit chips and displays. Typically, the sputtering chamber comprises an enclosure wall that encloses a process zone into which a process gas is introduced, a gas energizer to energize the process gas, and an exhaust port to exhaust and control the pressure of the process gas in the chamber. The chamber is used to sputter deposit a material from a sputtering target onto the substrate, such as a metal, for example, aluminum, copper, tungsten or tantalum; or a metal compound such as tantalum nitride, tungsten nitride or titanium nitride. In the sputtering processes, the sputtering target is bombarded by energetic ions, such as a plasma, causing material to be knocked off the target and deposited as a film on the substrate.

A typical semiconductor fabrication chamber has a target assembly including disc-shaped target of solid metal or other material supported by a backing plate that holds the target. To promote uniform deposition, the PVD chamber may have an annular concentric metallic ring, which is often called a shield, circumferentially surrounding the disc-shaped target. The gap between the inner surface of the shield and the circumferential surface of the target is typically referred to as the darkspace gap.

Figure 1:
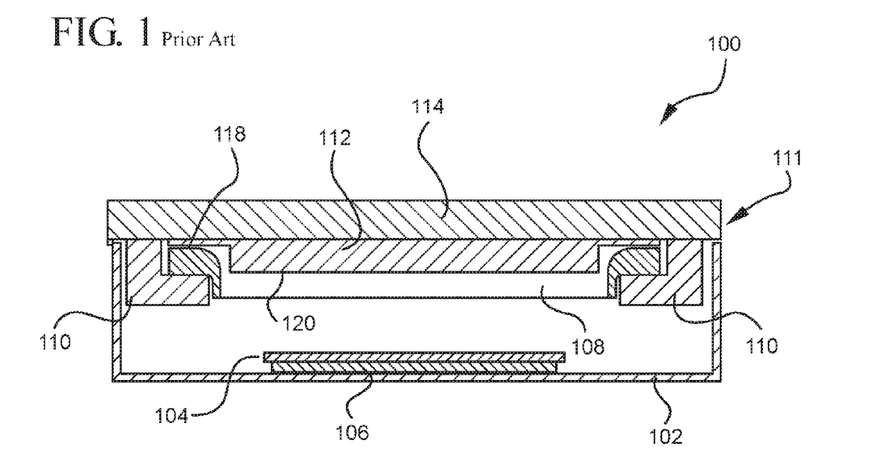
FIG. 1 is a schematic cross-sectional view of a prior art semiconductor fabrication chamber with a flat target.
Figure 2:
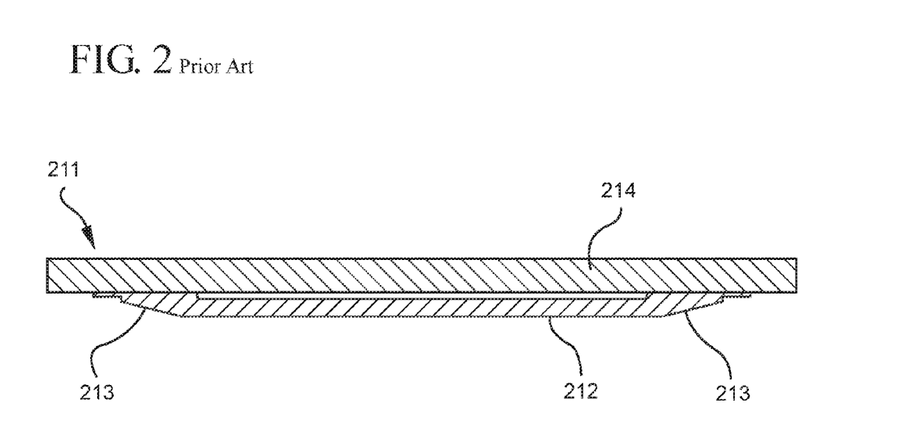
FIG. 2 is a schematic cross-sectional view of a prior art target assembly with a frustum target.

FIGS. 1 and 2 illustrate prior art arrangements of a target assemblies used within a PVD chamber. FIG. 1 is a schematic, cross-sectional illustration of a prior art a semiconductor fabrication chamber 100 comprising a chamber body 102 and a substrate 104 supported by a substrate support 106 within the chamber body 102. A target assembly 111 includes a target 112 supported by a backing plate 114. The target includes a front face or sputterable area 120 of disposed in a spaced relationship with respect to the substrate support 106. A shield 108 comprising a generally annular shaped metal ring extends circumferentially around the target. The shield 108 is held in place in the chamber by a shield support 110. The front face 120 of the target 112 is substantially flat.

FIG. 2 shows another configuration of a prior art target assembly 211 including a backing plate 214 and a target 212 joined to the backing plate. The target 212 is in the form of a frustum, and is generally convex in shape having two inwardly beveled edges 213 such that the outer peripheral portion of the target has a thickness less than the central region of the target.

In recent development of semiconductor industry, especially in high dielectric constant and metal gate applications, there is a stringent requirement of good uniformity for thin films on the order of 1 to 5 Angstroms, which poses a challenge to the traditional physical vapor deposition (PVD). In magnetron sputtering with longer spacing from target surface to the wafer, the film at wafer central region tends to be much thicker than the other locations on the wafer, which prevents film thickness uniformity from being achieved. There is a desire to provide thin film sputtering systems that are capable of providing better uniformity in film thickness across the entire radius of substrates.

SUMMARY

Accordingly, one or more embodiments of the invention are directed to a sputtering apparatus comprising a chamber having a wall defining a process area including a substrate support; a target spaced from the substrate support; and a power source coupled to the target to sputter material from the target, the target having a front face defining sputterable target surface extending between peripheral edges of the target and the sputterable target surface defining an overall concave shape substantially between the peripheral edges.

In one embodiment, the overall concave shape is defined by a substantially flat central region surrounded by a sloped region. In one embodiment, the sloped region is sloped at angle in the range of about 5 to 30 degrees such that the thickness at the peripheral edge of the target is greater than the thickness at the central region. In specific embodiments, the angle of the sloped region is in the range of about 7 and 15 degrees. In more specific embodiments, the angle of the sloped region is in the range of about 7 and 13 degrees.

In certain embodiments, the sloped region extends to the peripheral edge. In alternative embodiments, the sloped region extends to an outer peripheral front face area.

In one or more embodiments, the target peripheral edges define a target diameter $R_p$ and the central region has a diameter $R_c$, and the central region diameter is such that the ratio $R_c/R_p$ is from 0% to about 90%. In one or more embodiments, wherein the ratio $R_c/R_p$ is at least about 60% and less than about 90%. In specific embodiments, the ratio $R_c/R_p$ is about 70%.

Another aspect of the invention pertains to a target assembly for use in a sputtering chamber the target comprising a front face defining sputterable target surface extending between the peripheral edges and the sputterable target surface defining an overall concave shape substantially between the peripheral edges. In one embodiment, the overall concave shape is defined by a substantially flat central region surrounded by a sloped region. In one embodiment, the sloped region is sloped at angle in the range of about 5 to 20 degrees such that the thickness at the peripheral edge of the target is greater than the thickness at the central region, for example, in the range of about 7 and 15 degrees, more specifically, in the range of about 7 and 13 degrees. In specific embodiments, the target peripheral edges define a target diameter $R_p$ and the central region has a diameter $R_c$, and the central region diameter is such that the ratio $R_c/R_p$ is at least about 50% and less than about 90%. In other embodiments, the ratio $R_c/R_p$ is at least about 60% and less than about 90%. In a specific embodiment, the ratio $R_c/R_p$ is about 70%. In one embodiment, the target is joined to a backing plate.

Another aspect pertains to a method of improving radial uniformity of a sputtering process in a sputtering chamber comprising: disposing a target in the sputtering chamber in a spaced relationship with a substrate having a radial surface facing the target, the target comprising a front face defining sputterable target surface extending between peripheral edges of the target and the sputterable target surface defining an overall concave shape substantially between the peripheral edges; and sputtering material from the target such that material from the target is uniformly deposited across the radial surface of the substrate.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Figure 3A:
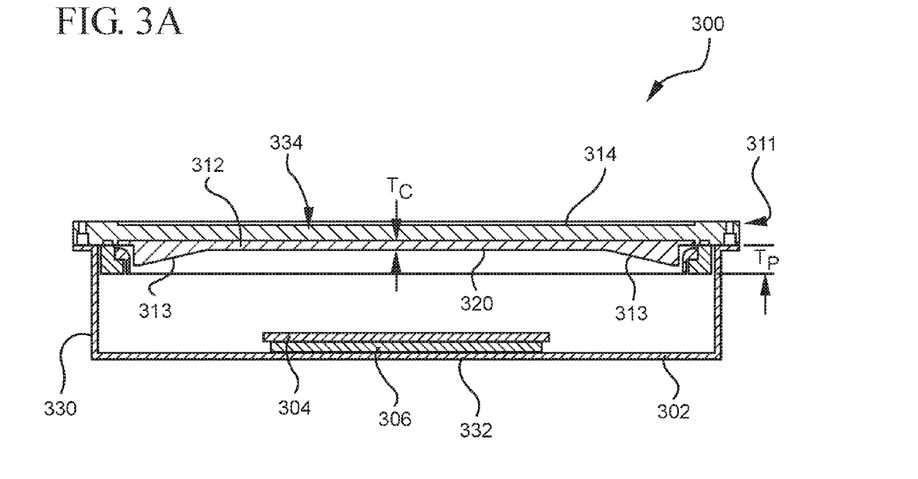
FIG. 3A is a schematic cross-sectional view of a semiconductor fabrication chamber including a target in accordance with a first embodiment.
Figure 3B:
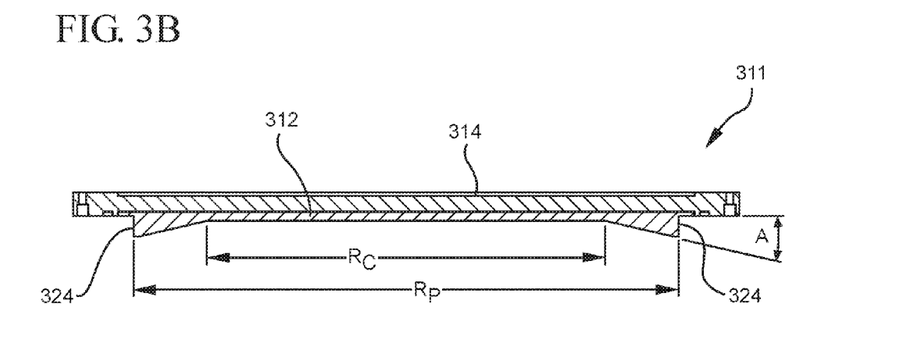
FIG. 3B is a schematic cross-sectional view of the target assembly shown in FIG. 3A.

Referring now to FIGS. 3A and 3B a first embodiment of a process chamber with a target having a generally concave shape is shown. FIG. 3A shows a semiconductor fabrication chamber 300 according to a first embodiment, comprising a chamber body 302 and a substrate 304 supported by a substrate support 306 within the chamber body 302. The substrate support 306 may be electrically floating or may be biased by a pedestal power supply (not shown). A target assembly 311 includes a target 312 supported by a backing plate 314. The target 312 includes a front face including sputterable area 320 of disposed in a spaced relationship with respect to the substrate support 306. An exemplary embodiment of a chamber 300 is a self-ionized plasma chamber, such as an SIP-type chamber, developed by Applied Materials, Inc. of Santa Clara, Calif. A typical chamber 300 comprises enclosure sidewalls, 330, a bottom wall 332 and a ceiling 334 defining a process area where the substrate 304 is disposed for a sputtering operation.

A process gas is introduced into the chamber 300 via a gas delivery system that typically includes a process gas supply (not shown) including one or more gas sources that feed one or more gas conduits that allow gas to flow into the chamber via a gas inlet that is typically an opening in one of the walls of the chamber. The process gas may comprise a non-reactive gas, such as argon or xenon that energetically impinges upon and sputters material from a target 312. The process gas may also comprise a reactive gas, such as one or more of an oxygen-containing gas and a nitrogen-containing gas, that are capable of reacting with the sputtered material to form a layer on the substrate 304. The target 312 is electrically isolated from the chamber 300 and is connected to a target power supply (not shown), for example, an RF power source, a DC power source, a pulsed DC power source, or a combined power source that uses RF power and/or DC power or pulsed DC power. In one embodiment, the target power source applies negative voltage to the target 312 energizing the process gas to sputter material from the target 312 and onto the substrate 304.

The sputtered material from the target, which is typically metal such as aluminum, titanium, tungsten or any other suitable material deposits on the substrate 304 and forms a solid layer of metal. This layer may be patterned and etched or followed by bulk metal deposition to form interconnecting layers in a semiconductor wafer.

In FIGS. 3A and 3B the target assembly 311 includes a backing plate 314 that is joined to the target 312. The back face of the target opposite the front face 320 is joined to the backing plate. It will be appreciated that the target 312 is usually joined to the backing plate by welding, brazing, mechanical fasteners or other suitable joining techniques. The backing plate can be fabricated from a high strength, electrically conductive metal in electrical contact with the target. The target backing plate 314 and target 312 may also be formed together as a unitary or integral structure, but typically, they are separate components joined together.

The target 312 has a front face 320 or sputterable area that faces the substrate 304 in the chamber extending between peripheral edges 324 of the target 312. It is understood that the front face 320 or sputterable area refers to the face of the target that is sputtered during a sputtering operation. The overall diameter of the target 312 is defined as the distance $R_p$ shown in FIG. 3B. As shown in FIG. 3B, the overall cross sectional shape of the front face 320 extending across the peripheral diameter $R_p$ extending substantially between peripheral edges 324 is concave. The concave shape is defined by edge regions 313 of the front face 320 that are sloped or beveled such that the thickness $T_p$ at the outer periphery of the target 312 is greater than the thickness $T_c$ in a central region of the front face defined by diameter $R_c$. It will be appreciated that the central region diameter Rc is less than the overall diameter $R_p$ between the peripheral edges 324. The edge regions 313 define a peripheral area that surrounds the central region of the target. The central region is substantially defined by the distance $R_c$ is substantially flat.

It will be understood that the thickness Tp at the peripheral edge will be determined by angle of slope indicated by "A" in FIG. 3B and the length of the sloped or beveled edge regions 313, which is determined by the ratio of the central region diameter $R_c$ to overall target diameter $R_p$. In the embodiment shown, the ratio of Rc/Rp is in the range of about 60% to 75%. This ratio of Rc/Rp can be about 0%, 10%, 20%, 30%, 40%, 50%, 60%, 70%, 80% or 90%, [and this ratio can be optimized by for different target materials experimentation to optimize uniform deposition of films on the substrate 304. The angle "A" of the slope edge 313 as defined as the angle of the slope or bevel from the central region can vary between about 5 and 30 degrees, with a more specific range between about 5 and 20 degrees, or 7 and 15 degrees, and a most specific range between about 7 and 13 degrees. The angle "A" of the sloped edge 313 can be optimized by experimentation to obtain uniform radial deposition across the diameter of a substrate 304.

Figure 3C:
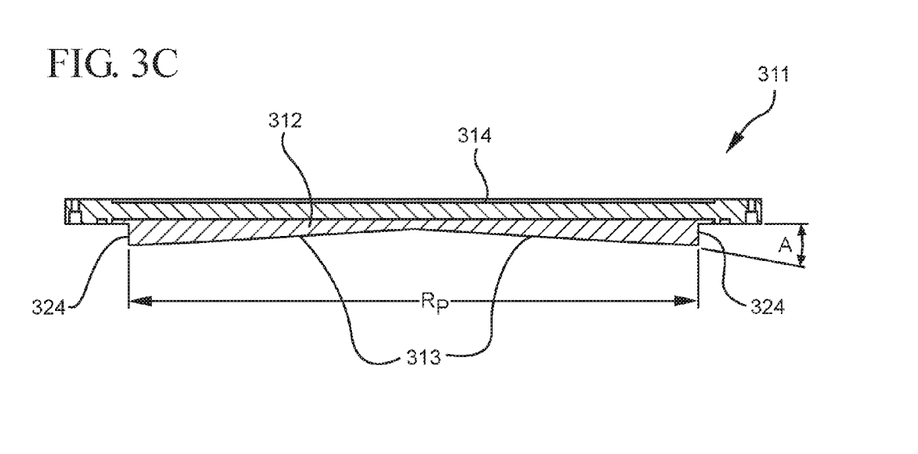
FIG. 3C is a schematic cross-sectional view of an alternative embodiment of a target assembly.
Figure 3D:
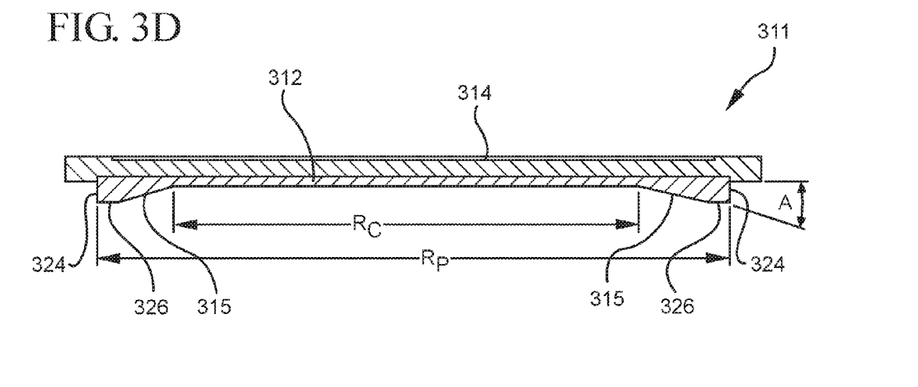
FIG. 3D is a schematic cross-sectional view of an alternative embodiment of a target assembly.
Figure 3E:
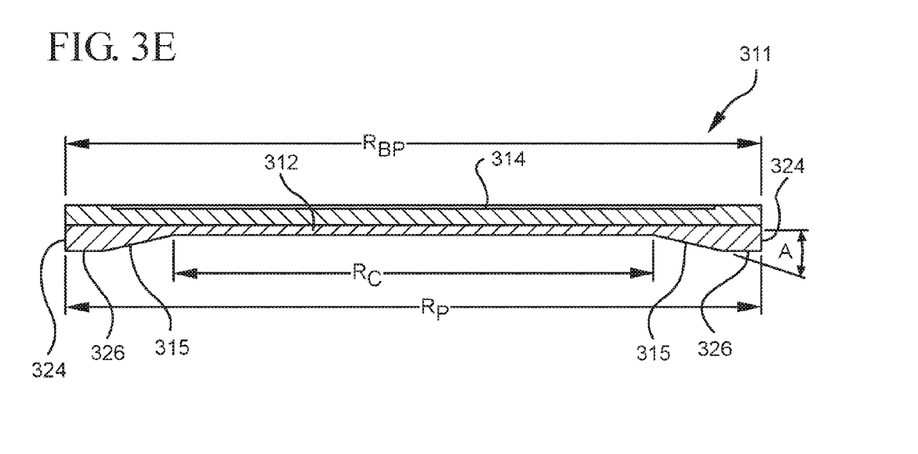
FIG. 3E is a schematic cross-sectional view of an alternative embodiment of a target assembly.

FIG. 3C shows an alternative embodiment of a target in which Rc equal to approximately 0 and the ratio of $R_c/R_p$ is about 0%. In other words, the sloped edges 313 extend from the outer peripheral edge 324 of the target and meet in a central region of the target 312. FIG. 3D shows yet another alternative embodiment in which the sloped edges do not extend to the outer peripheral edge 324 of the target. Instead, sloped regions 315 extend to an outer peripheral front face area 326 that surrounds the sloped edge and is substantially flat, and the outer peripheral edge 324 of the target bounds the outer peripheral front face area 326. FIG. 3E shows a variant of the design shown in FIG. 3D. In FIG. 3E, peripheral edge regions extend to edge 318 of the backing plate 314 so that the diameter of the target $R_T$ is substantially equal to the diameter of the backing plate $R_{BP}$. The outer peripheral front face 326 in FIG. 3E is larger than the outer peripheral front face in FIG. 3D, which can prevent contamination from the backing plate during sputtering. It will be appreciated that the sloped regions 315 in FIGS. 3D and 3E extend substantially between the peripheral edges 324. Rather than extending to the actual peripheral edges 324, the sloped regions 315 extend to the outer peripheral front face area 326. In one or more embodiments, the outer peripheral front face area 326 comprises no more than about 30%, 20% or 10% of the sputterable surface area of the target. Thus, according to one or more embodiments, when the overall concave shape of sputterable surface is said to extend "substantially between the edges" of the target, this is intended to mean that the overall concave shape extends from a central region of the target to the peripheral edge or to an outer peripheral region that comprises not more than about 30% of the sputterable surface.

The thickness $T_c$ of the target in the central region can vary between ⅛" and the thickness $T_p$ at the outer peripheral edges 324 can vary between ⅛"-¾". It will be understood of course, that these thickness and other dimensions can be varied to optimize the deposition properties of the particular sputtering process. In another variant, while the sloped edges are shown as being flat, the sloped edges 313 may have a concave or convex profile.

Another aspect of the invention pertains to a method of sputtering material from concave targets in a sputtering chamber of the type described above to improve radial uniformity of the sputtering process. The method includes disposing a target in the sputtering chamber in a spaced relationship with a substrate having a radial surface facing the target. The target includes a front face defining sputterable target surface extending between peripheral edges of the target, and the sputterable surface defines an overall concave shape substantially between the peripheral edges. The method further includes sputtering material from the target such that material from the target is uniformly deposited across the radial surface of the substrate.

Various experiments were run in chambers using DC and RF power to show the effects of utilizing a concave-shaped target with a sloped or beveled edge region. FIGS. 4 through 7 show experimental data using sloped targets. FIG. 4 through 7 is a graph comparing film thickness and thickness non-uniformity data for three target designs, a concave target of the type shown in FIGS. 3A and 3B, a flat target of the type shown in FIG. 1 and a frustum target of the type shown in FIG. 2. The concave target had an overall diameter $R_p$ of approximately 17.5 inches, a central region diameter $R_c$ of about 12 inches (such that the ratio $R_c/R_p$ was about 68.5%), and an edge slope about 7 degrees, except in FIG. 5 where varying slopes were tested.

Figure 4:
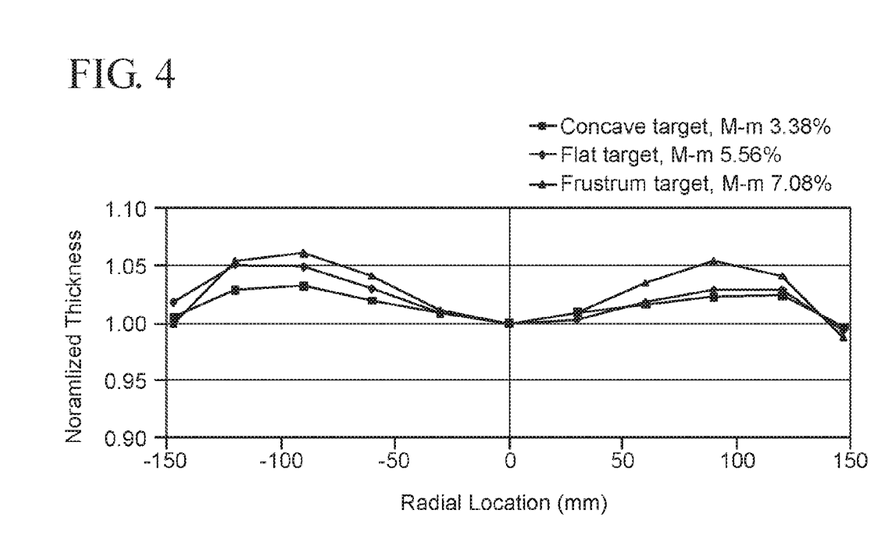
FIG. 4 is a graph comparing film thickness data of TiN films for three target designs.
Figure 5:
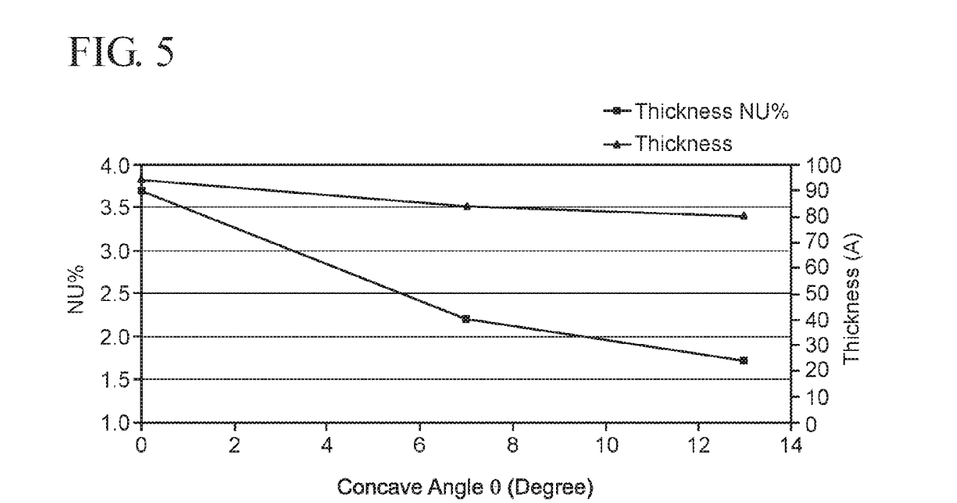
FIG. 5 is a graph showing the effect on angle of the sloped target edge on thickness and thickness non-uniformity of TiN films.

FIGS. 4 and 5 shows data using titanium targets in a RF chamber, and the process parameters in the chamber were kept constant for different targets. FIG. 4 shows the normalized thickness versus radial location on a 300 mm substrate. It can be seen the concave target showed a variation of 3.38%, while the flat target produced a variation of 5.56%, and the frustum target produced a variation of 7.08%. FIG. 5 shows the effect on angle of the sloped target edge on thickness and thickness non-uniformity of films, where the X axis is the angle varied between 0 and 13 degrees and the Y axes show non-uniformity (NU %) and thickness of the films.

Figure 6A:
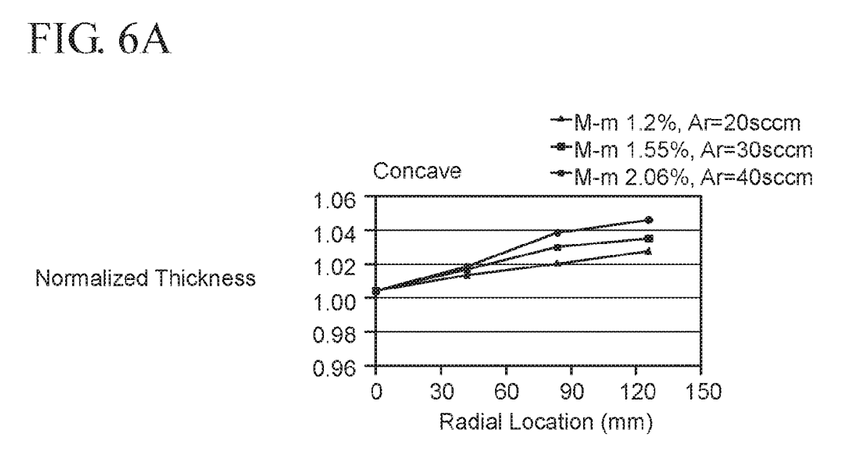
FIG. 6A is a graph produced in a process using RF power showing the effect of Ar gas flow rate on normalized Al thickness for a target in accordance with an embodiment of the present invention.
Figure 6B:
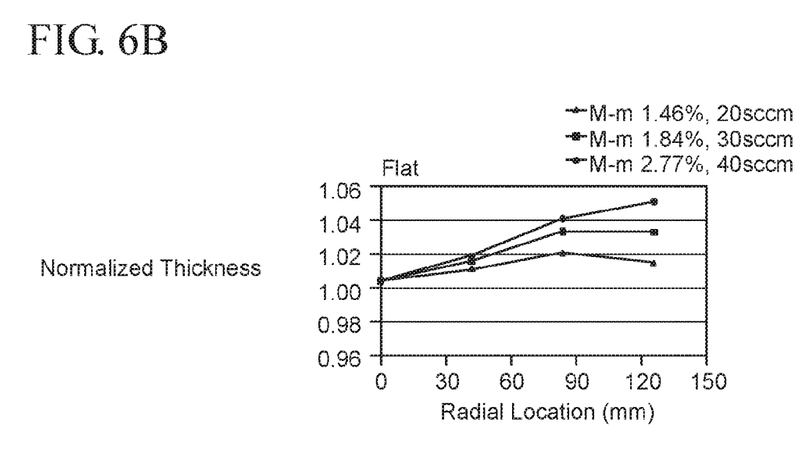
FIG. 6B is a comparative graph produced in a process using RF power showing the effect of Ar gas flow rate on normalized Al thickness for a flat target.

FIG. 6A shows data produced in an RF powered sputtering chamber using an aluminum concave target. Normalized aluminum thickness was measured at various radial locations on a 300 mm substrate. FIG. 6A shows the effect of Ar gas flow rate on normalized Al thickness for argon flow rates of 20 sccm, 30 sccm and 40 sccm. FIG. 6B shows the effect of Ar gas flow rate on normalized Al thickness for a flat target at the same argon flow rates as in FIG. 6A. A comparison of the data in FIGS. 6A and 6B shows the uniformity for the concave target is better than that for the flat target, and that argon flow rate had less of an impact on radial uniformity for the concave target.

Figure 6C:
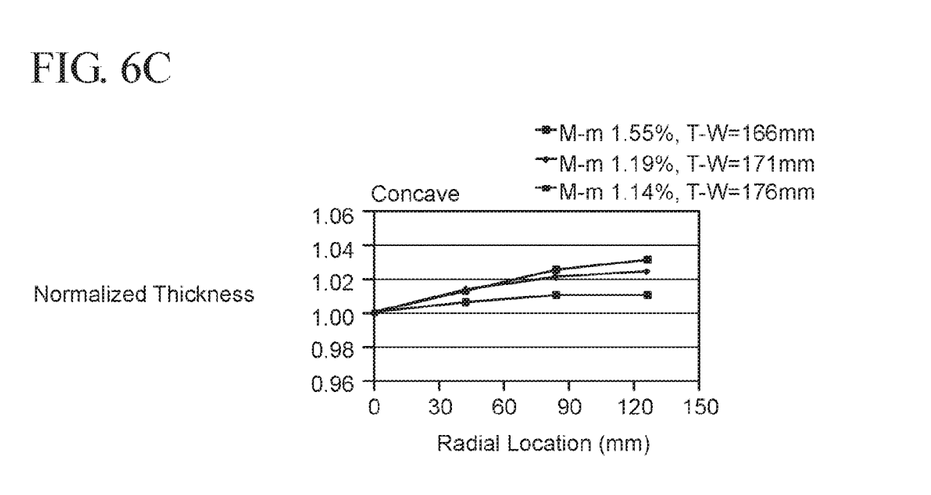
FIG. 6C is a graph produced in a process using RF power showing the effect of target-wafer spacing (T-W) on normalized Al thickness for a target in accordance with an embodiment of the present invention.
Figure 6D:
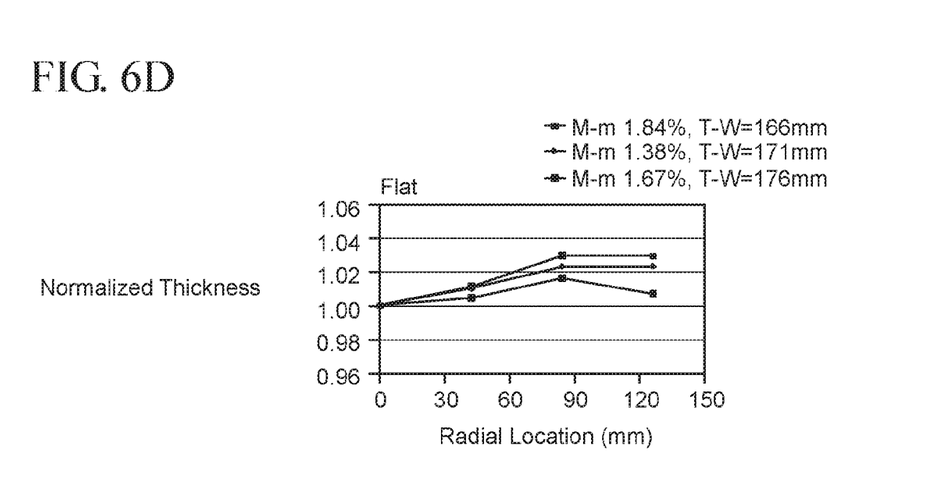
FIG. 6D is a comparative graph produced in a process using RF power showing the effect of target-wafer spacing (T-W) on normalized Al thickness for a flat target.

FIG. 6C shows the effect of target-wafer spacing (T-W) on normalized Al thickness for a target for a concave target and FIG. 6D shows the effect of target-wafer spacing (T-W) on normalized Al thickness for a flat target. The concave target showed better uniformity and less variance in thickness across the radial surface of the substrate as the target-wafer distance was adjusted than the flat target.

Figure 6E:
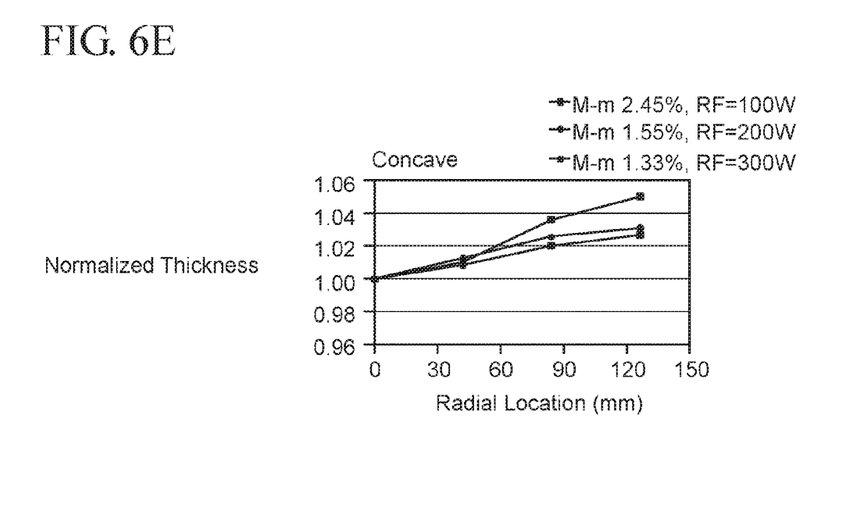
FIG. 6E is a graph produced in a process using RF power showing the effect of power level (RF) on normalized Al thickness for a target in accordance with an embodiment of the present invention.
Figure 6F:
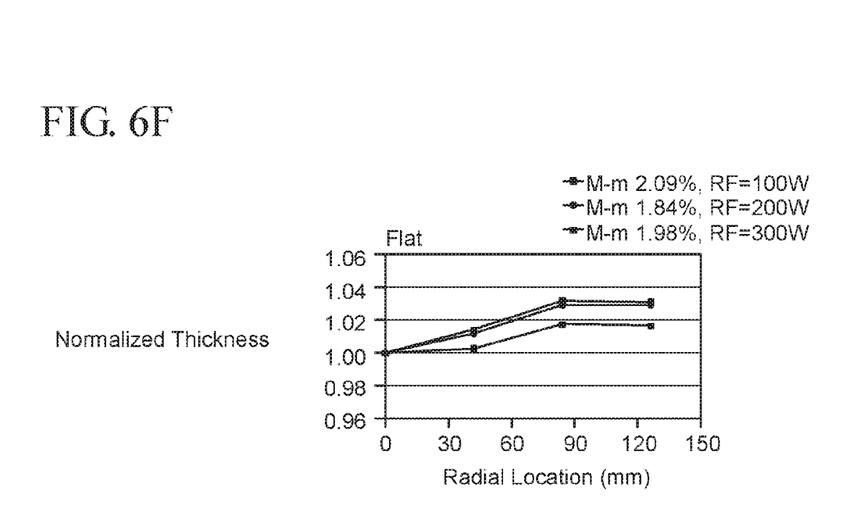
FIG. 6F is a comparative graph produced in a process using RF power showing the effect of power level (RF) on normalized Al thickness for a flat target.

FIG. 6E shows the effect of power level (RF) on normalized Al thickness for a concave target and FIG. 6F shows the effect of power level (RF) on normalized Al thickness for a flat target. The concave target showed that much better film uniformity can be achieved by optimizing the sputtering power than the flat target.

Figure 7A:
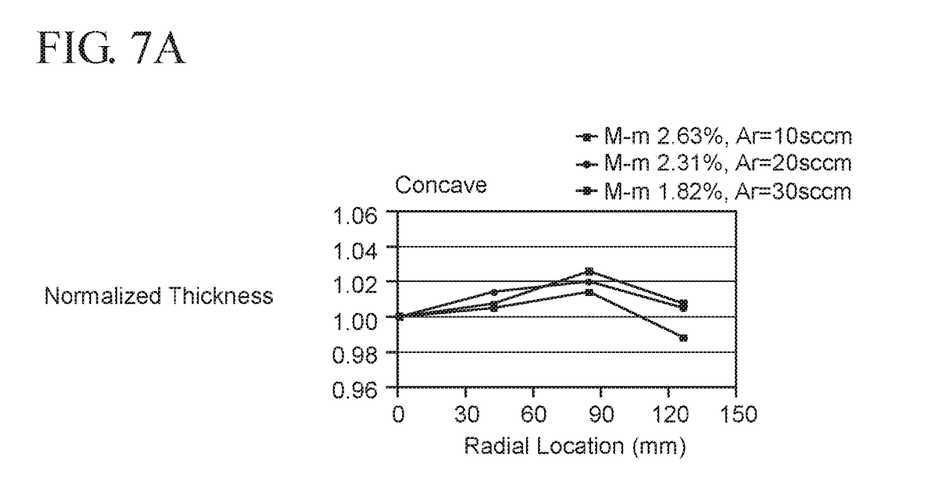
FIG. 7A is a graph produced in a process using DC power showing the effect of Ar gas flow rate on normalized Al thickness for a target in accordance with an embodiment of the present invention.
Figure 7B:
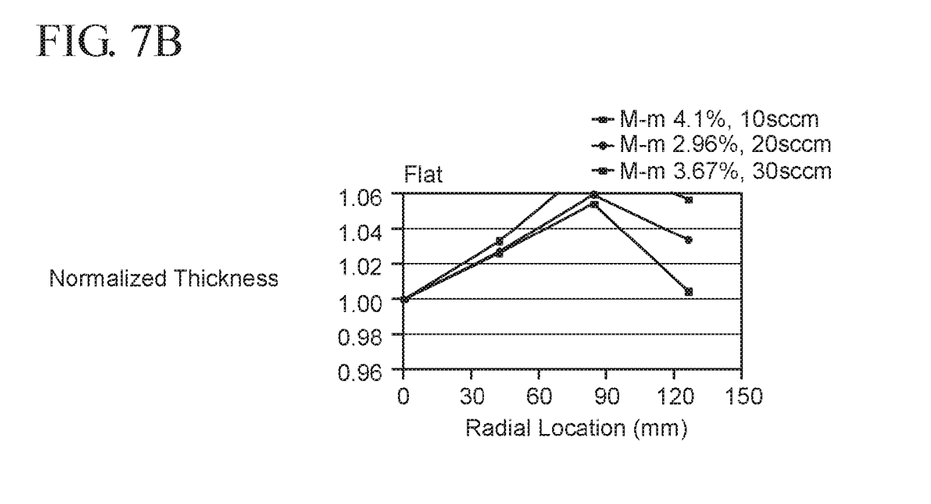
FIG. 7B is a comparative graph produced in a process using DC power showing the effect of Ar gas flow rate on normalized Al thickness for a flat target.

FIGS. 7A-F were produced in a DC powered chamber using aluminum targets that were concave and flat. The concave target had dimensions similar to those described above. FIG. 7A shows the effect of Ar gas flow rate on normalized Al thickness for a concave target and FIG. 7B shows the effect of Ar gas flow rate on normalized Al thickness for a flat target. The concave target produced much better radial uniformity of Al thickness than the flat target.

Figure 7C:
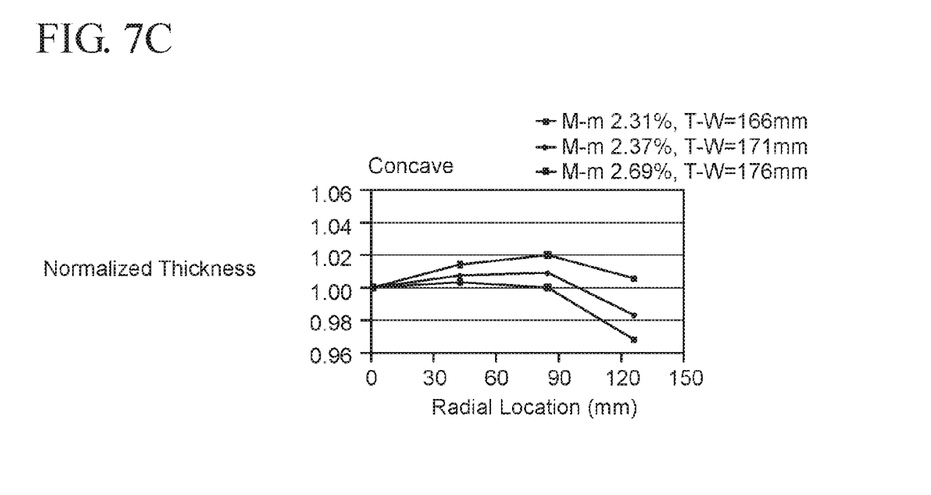
FIG. 7C is a graph produced in a process using DC power showing the effect of target-wafer spacing (T-W) on normalized Al thickness for a target in accordance with an embodiment of the present invention.
Figure 7D:
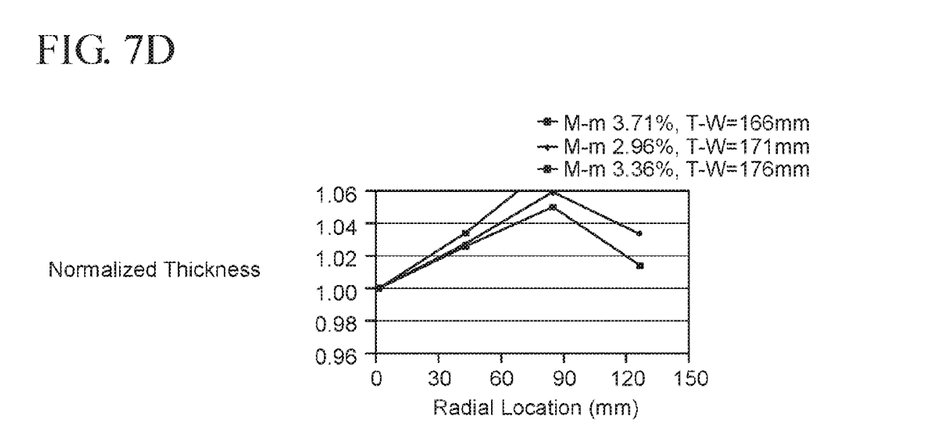
FIG. 7D is a comparative graph produced in a process using DC power showing the effect of target-wafer spacing (T-W) on normalized Al thickness for a flat target.

FIG. 7C shows the effect of target-wafer spacing (T-W) on normalized Al thickness for a concave target and FIG. 7D shows the effect of target-wafer spacing (T-W) on normalized Al thickness for a flat target. The concave target showed better radial uniformity of Al thickness.

Figure 7E:
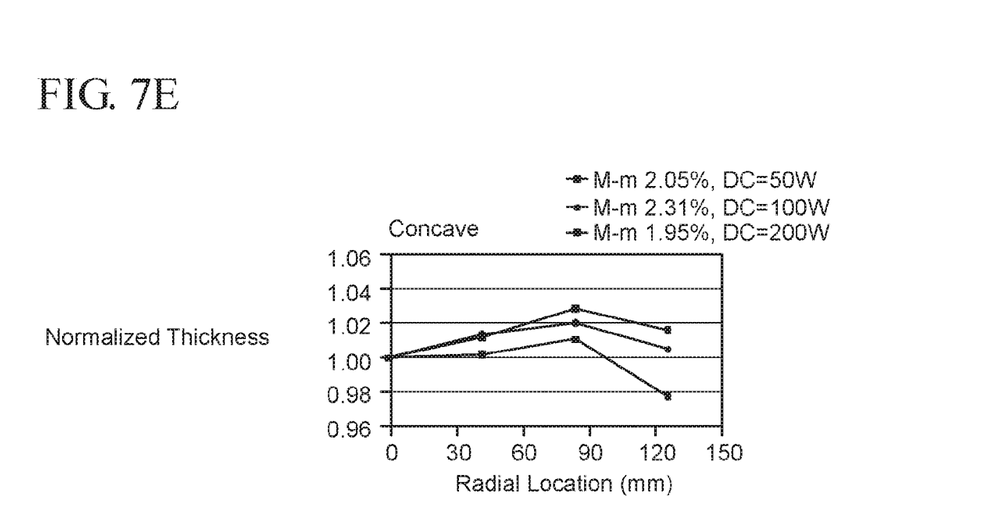
FIG. 7E is a graph produced in a process using DC power showing the effect of power level (DC) on normalized Al thickness for a target in accordance with an embodiment of the present invention.
Figure 7F:
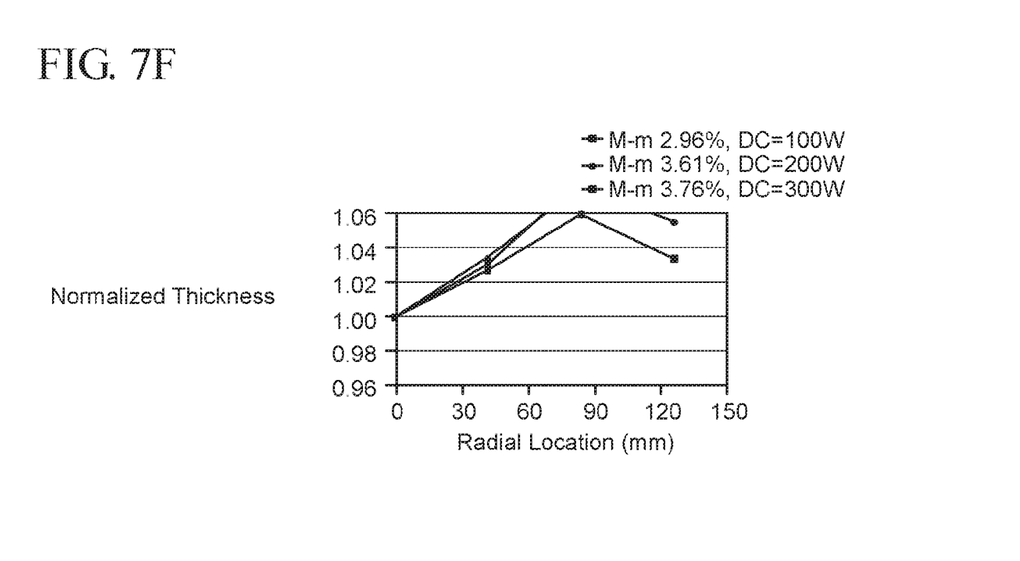
FIG. 7F is a comparative graph produced in a process using DC power showing the effect of power level (DC) on normalized Al thickness for a flat target.

FIG. 7E is a graph shows the effect of power level (DC) on normalized Al thickness for a target in accordance with an embodiment of the present invention and FIG. 7F shows the effect of power level (DC) on normalized Al thickness for a flat target. The concave target showed better radial uniformity of Al thickness.

The above data show that concave targets exhibited better radial uniformity across the radial surface of the substrates for both DC and RF powered chambers for varying process conditions of power, target-wafer spacing and process gas flow rate. Thus, by using a concave-shaped target of the type shown in FIGS. 3A and 3B will result in greater uniformity of deposition across the radial surface of substrates. In addition, variation in process parameters such as target-wafer spacing, process gas flow rate and power is expected to have less of an effect on radial uniformity of deposition.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A physical vapor deposition target comprising a front face defining sputterable target surface, the front face extending between peripheral edges of the target, the sputterable target surface defining an overall concave shape substantially between the peripheral edges, the overall concave shape defined by a substantially flat central region surrounded by a sloped region, wherein the target comprises one or more of aluminum, titanium or tungsten and the target peripheral edges define a target diameter $R_p$ and the flat central region has a diameter $R_c$, and the central region diameter is such that the ratio $R_c/R_p$ is about 68.5%, the sloped region has an angle of about 7 degrees such that a thickness at the peripheral edge of the target is in the range of about ⅛ inch to about ¾ inch and is greater than a thickness at the central region, and the angle of the sloped region and $R_c/R_p$ are configured to deposit a film of uniform thickness on a flat substrate surface.

2. The physical vapor deposition target of claim 1, wherein the sloped region extends to the peripheral edge.

3. The physical vapor deposition target of claim 1, wherein the sloped region extends to an outer peripheral front face area.

4. The physical vapor deposition target of claim 3, wherein the outer peripheral front face comprises not more than about 30% of sputterable surface area.

5. The physical vapor deposition target of claim 1, further comprising a backing plate in contact with a back face of the target.

6. The physical vapor deposition target of claim 5, wherein the backing plate is joined to the target by one or more of welding, brazing or mechanical fasteners.

7. The physical vapor deposition target of claim 5, wherein the backing plate comprises an electrically conductive metal.

8. The physical vapor deposition target of claim 5, wherein the target diameter is substantially equal to a diameter of the backing plate.

9. A physical vapor deposition target assembly comprising:
a target having a front face defining sputterable target surface and a back face, the front face extending between peripheral edges of the target, the sputterable target surface defining an overall concave shape substantially between the peripheral edges, the overall concave shape defined by a substantially flat central region surrounded by a sloped region, wherein the target comprises one or more of aluminum, titanium or tungsten and the target peripheral edges define a target diameter $R_p$ and the flat central region has a diameter $R_c$, and the central region diameter is such that the ratio $R_c/R_p$ is about 68.5%, the sloped region has an angle of about 7 degrees such that a thickness at the peripheral edge of the target is in the range of about ⅛ inch to about ¾ inch and is greater than a thickness at the central region, and the angle of the sloped region and $R_c/R_p$ are configured to deposit a film of uniform thickness on a flat substrate surface; and a backing plate in contact with the back face of the target.

10. The physical vapor deposition target assembly of claim 9, wherein the sloped region extends to the peripheral edge.

11. The physical vapor deposition target assembly of claim 9, wherein the sloped region extends to an outer peripheral front face area.

12. The physical vapor deposition target assembly of claim 9, wherein the outer peripheral front face comprises not more than about 30% of sputterable surface area.

13. The physical vapor deposition target assembly of claim 5, wherein the backing plate is joined to the target by one or more of welding, brazing or mechanical fasteners.

14. The physical vapor deposition target assembly of claim 5, wherein the backing plate comprises an electrically conductive metal.

15. The physical vapor deposition target assembly of claim 5, wherein the target diameter is substantially equal to a diameter of the backing plate.

* * * * *